United States Patent
Summers

(10) Patent No.: US 7,807,547 B2
(45) Date of Patent: Oct. 5, 2010

(54) WAFER BONDING MATERIAL WITH EMBEDDED RIGID PARTICLES

(75) Inventor: Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 932 days.

(21) Appl. No.: 11/390,085

(22) Filed: Mar. 28, 2006

(65) Prior Publication Data

US 2007/0238262 A1 Oct. 11, 2007

(51) Int. Cl.
*H01L 21/30* (2006.01)
*H01L 23/12* (2006.01)

(52) U.S. Cl. ............... 438/455; 438/118; 257/E21.499; 257/E23.137; 257/704

(58) Field of Classification Search ................. 430/200; 438/455, 48, 51–53, 107, 118; 257/E21.567, 257/E21.48, E21.499, E21.506, E21.509, 257/E21.519, 704, E23.137

See application file for complete search history.

(56) References Cited

U.S. PATENT DOCUMENTS

| | | | |
|---|---|---|---|
| 5,293,511 A | | 3/1994 | Poradish et al. |
| 6,062,461 A * | | 5/2000 | Sparks et al. ............ 228/123.1 |
| 6,368,704 B1 * | | 4/2002 | Murata et al. ............... 428/323 |
| 6,518,097 B1 * | | 2/2003 | Yim et al. .................... 438/119 |
| 6,528,343 B1 * | | 3/2003 | Kikuchi et al. .............. 438/106 |
| 6,584,681 B2 * | | 7/2003 | Lorenz et al. ................. 29/830 |
| 6,710,455 B2 | | 3/2004 | Goller et al. |
| 6,802,930 B2 | | 10/2004 | Chuang et al. |
| 6,844,959 B2 * | | 1/2005 | Huibers et al. ............... 359/297 |
| 7,462,931 B2 * | | 12/2008 | Summers ..................... 257/704 |
| 2002/0063321 A1 * | | 5/2002 | Sauter et al. ................. 257/678 |
| 2002/0115263 A1 * | | 8/2002 | Worth et al. ................. 438/455 |
| 2003/0054588 A1 * | | 3/2003 | Patel et al. ................... 438/107 |
| 2003/0087045 A1 * | | 5/2003 | Nakata et al. .............. 428/1.27 |
| 2003/0157426 A1 * | | 8/2003 | Jordan et al. ................. 430/200 |
| 2004/0087043 A1 * | | 5/2004 | Lee et al. ......................... 438/6 |
| 2004/0177921 A1 * | | 9/2004 | Yamauchi .................... 156/277 |
| 2005/0006442 A1 * | | 1/2005 | Stillabower ............ 228/180.22 |
| 2005/0036090 A1 * | | 2/2005 | Hayashi et al. .............. 349/122 |
| 2005/0058841 A1 * | | 3/2005 | Baney et al. ................. 428/428 |
| 2005/0111797 A1 * | | 5/2005 | Sherrer et al. .................. 385/93 |
| 2005/0170656 A1 * | | 8/2005 | Nasiri et al. ................. 438/700 |
| 2007/0048898 A1 * | | 3/2007 | Carlson et al. .............. 438/106 |
| 2007/0238262 A1 * | | 10/2007 | Summers ..................... 438/455 |
| 2007/0295456 A1 * | | 12/2007 | Gudeman et al. ......... 156/379.7 |
| 2009/0053855 A1 * | | 2/2009 | Summers ..................... 438/112 |

FOREIGN PATENT DOCUMENTS

WO    WO 9722993    *    6/1997

* cited by examiner

*Primary Examiner*—Matthew C Landau
*Assistant Examiner*—Latanya Crawford
(74) *Attorney, Agent, or Firm*—Jaquelin K. Spong

(57) ABSTRACT

A material for bonding a lid wafer to a device wafer, which includes an adhesive substance with rigid particles embedded in the adhesive substance. The rigid particles may be particles or spheres of alumina, silica, or diamond, for example. The adhesive substance may be glass frit, epoxy, glue, cement or solder, for example. When the adhesive is applied and melted, and pressure is applied between the lid wafer and the device wafer, the lid wafer approaches the device wafer until a minimum separation is reached, which is defined by the rigid particles.

13 Claims, 4 Drawing Sheets

WAFER BONDING MATERIAL WITH EMBEDDED RIGID PARTICLES

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to a microelectromechanical systems (MEMS) device and its method of manufacture. More particularly, this invention relates to a material and process for bonding MEMS wafers with a protective lid wafer.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. A moveable MEMS switch, for example, may be a cantilevered beam which connects one or more input terminals to one or more output terminals, all microfabricated on a substrate. The actuation means for the moveable cantilevered beam switch may be thermal, piezoelectric, electrostatic, or magnetic, for example.

Because the MEMS devices often have moveable components, such as the cantilevered beam, they typically require protection of the vulnerable moveable portions by sealing the devices in a protective cap or lid wafer, to form an encapsulated device. Furthermore, if the MEMS device is intended to operate in a particular environment, for example, a MEMS switch handling high voltages may be required to operate in an electrically insulating environment, and thus the MEMS switch may be encapsulated with an electrically insulating gas. In order to prevent the preferred gas environment from leaking out over the lifetime of the switch, the environment may need to be sealed hermetically when the lid wafer and the device wafer are bonded.

The lid wafer may be secured to the device layer by some adhesive means, such as a low outgassing epoxy. To fabricate the encapsulated MEMS device, a device wafer upon which the MEMS devices have been fabricated using the batch processing techniques, is placed against the lid wafer. Adhesive has been placed on the device wafer or the lid wafer, or both. The device wafer is pressed against the lid wafer, and heat is applied to melt or cure the adhesive. After curing, the device wafer and lid wafer assembly is generally sawed to singulate the individual devices.

Many adhesives such as epoxies, cements and glues are liquid during application, and only harden upon curing. Alternatively, an adhesive such as a solder or metal can be melted until it flows, and then cooled to harden. In either case, the adhesive may need to be a liquid at some point in order to accommodate variations in the surfaces of the lid wafer and the device wafer and securely bond the surfaces. The liquid will, in general, flow outward from the bond region during assembly, such that a rigid feature or standoff may need to be provided in the lid wafer or device wafer to define a minimum separation between the lid wafer and the device wafer. The separation may be that required to accommodate the height of the MEMS device, as well as some extra room to accommodate its movement.

FIG. 1 shows an example of a portion of a prior art lid wafer for forming the protective lid for a MEMS device and having a standoff to define the minimum separation between a lid wafer and a device wafer. The MEMS device 140, is shown only schematically in FIG. 1, because the details of the MEMS device 140 are not essential to the understanding of this invention. The MEMS device 140 has been previously formed on device wafer 150. The lid wafer 160 is processed to form a recessed region 170. This recess is sufficiently deep to provide clearance for the MEMS device 140 and its movement. The recess 170 may be formed, for example, by reactive ion etching the surface of the lid wafer 160, after appropriate patterning with photoresist. During formation of recess 170, the mechanical standoffs 120 may be formed by protecting these areas from the reactive ion etching process. Alternatively, standoffs 120 may be formed by depositing a material, such as a metal film, in these regions.

The device wafer 150 is generally bonded to the lid wafer 160 with an adhesive bond, using a wafer bonding tool (not shown in FIG. 1). To achieve the adhesive bond, a layer of adhesive 110 is deposited on a cap or lid wafer 160, or on the device wafer 150, around the perimeter of the MEMS device 140. The device wafer and lid wafer may be aligned so that the standoff features 120 are properly placed with respect to the MEMS devices 140, and clamped together to form the wafer assembly 100. The wafer assembly 100 may then mounted in the wafer bonding tool. The assembly 100 may then be heated to liquefy or cure the adhesive 110. Because of the pressure, the liquid adhesive 110 flows outward from the bond region, allowing the device wafer 150 and the lid wafer 160 to come within a minimum distance defined by the standoffs 120. The assembly 100 is allowed to remain stationary until the device wafer 150 is permanently bonded to the lid wafer 160. The assembly 100 is then cooled and removed from the wafer bonding tool. The devices are subsequently singulated, to form the individual encapsulated MEMS devices, Using the approach illustrated in FIG. 1, the lid wafer 160 must be processed to form the standoffs 120 before alignment and bonding to the device wafer 150. This processing may take the form of one or more additional photolithography steps, such as deposition of photoresist, patterning of the photoresist, and followed by etching of the lid wafer 160. These additional steps add cost and complexity to the formation of the encapsulated MEMS device.

SUMMARY

Materials and processes are described here which address the above-mentioned problems, and may be particularly applicable to the formation of MEMS devices fabricated on a device wafer and encapsulated with a lid wafer. The materials and processes described herein use non-melting rigid particles mixed in an adhesive substance to form a bonding material, and the bonding material is then applied to one or both the lid wafer and the device wafer. The adhesive substance of the bonding material bonds the device wafer to the lid wafer, and upon melting or curing the adhesive substance, the rigid particles in the bonding material define a minimum separation between the device wafer and the lid wafer. Accordingly, there is no need to fabricate the standoffs on the lid wafer to define the minimum separation between the wafers, thus saving manufacturing time and expense.

The bonding material therefore bonds a lid wafer to a device wafer, and includes an adhesive substance which adheres the lid wafer to the device wafer and at least one rigid particle in the adhesive substance, which defines a minimum separation between the lid wafer and the device wafer.

The rigid particles may be, for example, hard spheres, of a diameter chosen to provide an appropriate distance between the wafers. The rigid spheres may be made of, for example, alumina, silica, metal, diamond or any other material that maintains its shape under the processing conditions required to use the bonding material. The adhesive substance may include, for example, glass frit, glue, cement, epoxy or solder. Upon the melting of the adhesive and the pressing of the wafers together, a minimum separation is defined by the presence of the hard spheres in the adhesive, between the wafers.

The adhesive with incorporated rigid particles may be manufactured by mixing a powder of the rigid spheres into the adhesive substance to form a paste or suspension. Additional solvent may be added to the mixture to maintain proper bonding material viscosity. For example, to make a high temperature, hermetic seal, the sapphire spheres may be mixed with a paste of glass frit. The mixture may then be applied to the lid wafer and heated to remove the solvent of the glass frit. The lid wafer may then be assembled with the device wafer and the assembly placed under pressure. Heat may be applied to melt the frit. As the frit melts, the wafers approach each other to a minimum distance defined by the diameter of the sapphire spheres. The assembly may then be cooled and the wafers singulated to form the encapsulated MEMS devices.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be particularly applicable to encapsulated MEMS devices. However, it should be understood that this embodiment is exemplary only, and that the methods disclosed herein may be used in any application wherein devices are formed on a device layer and encapsulated with a lid wafer.

Figure 1:
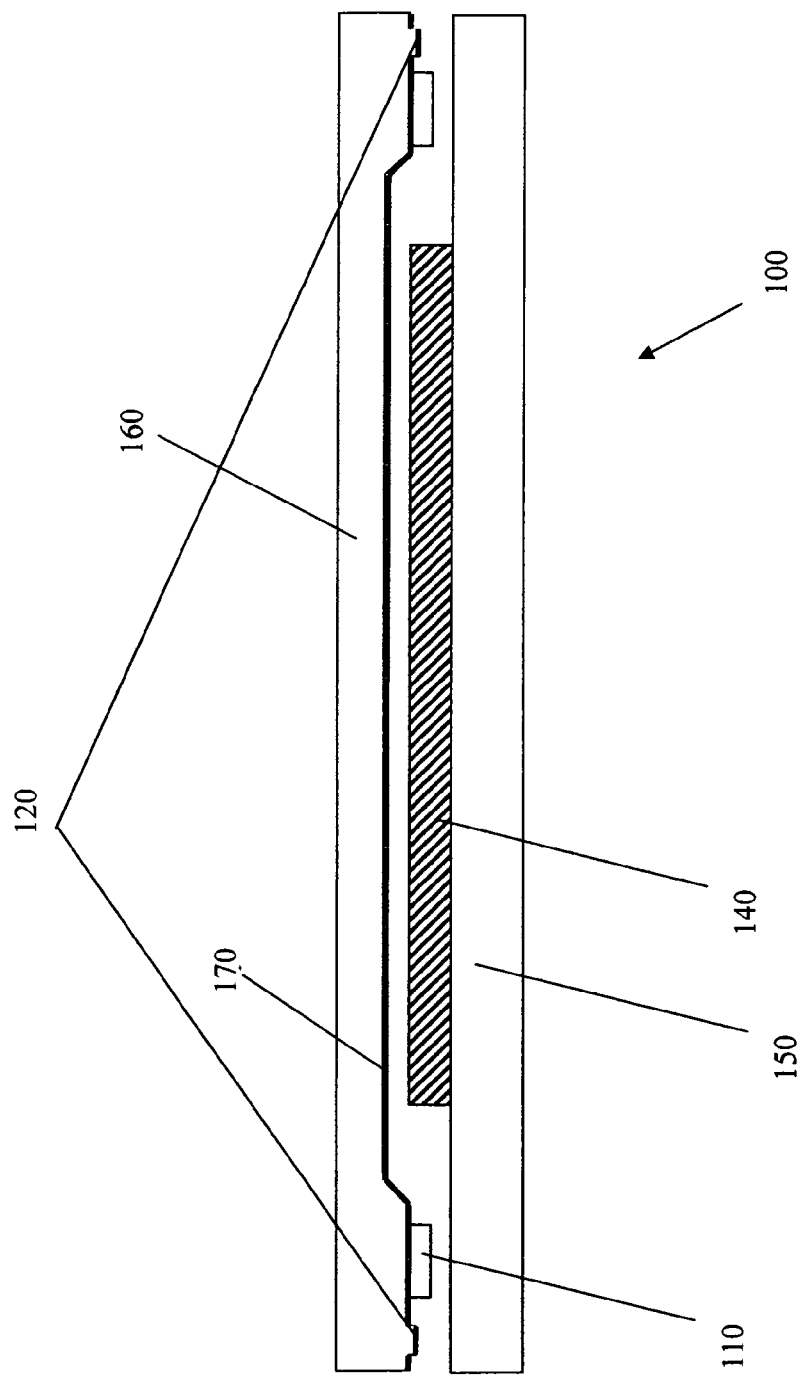
FIG. 1 is a diagram showing a prior art lid wafer and device wafer assembly.
Figure 2:
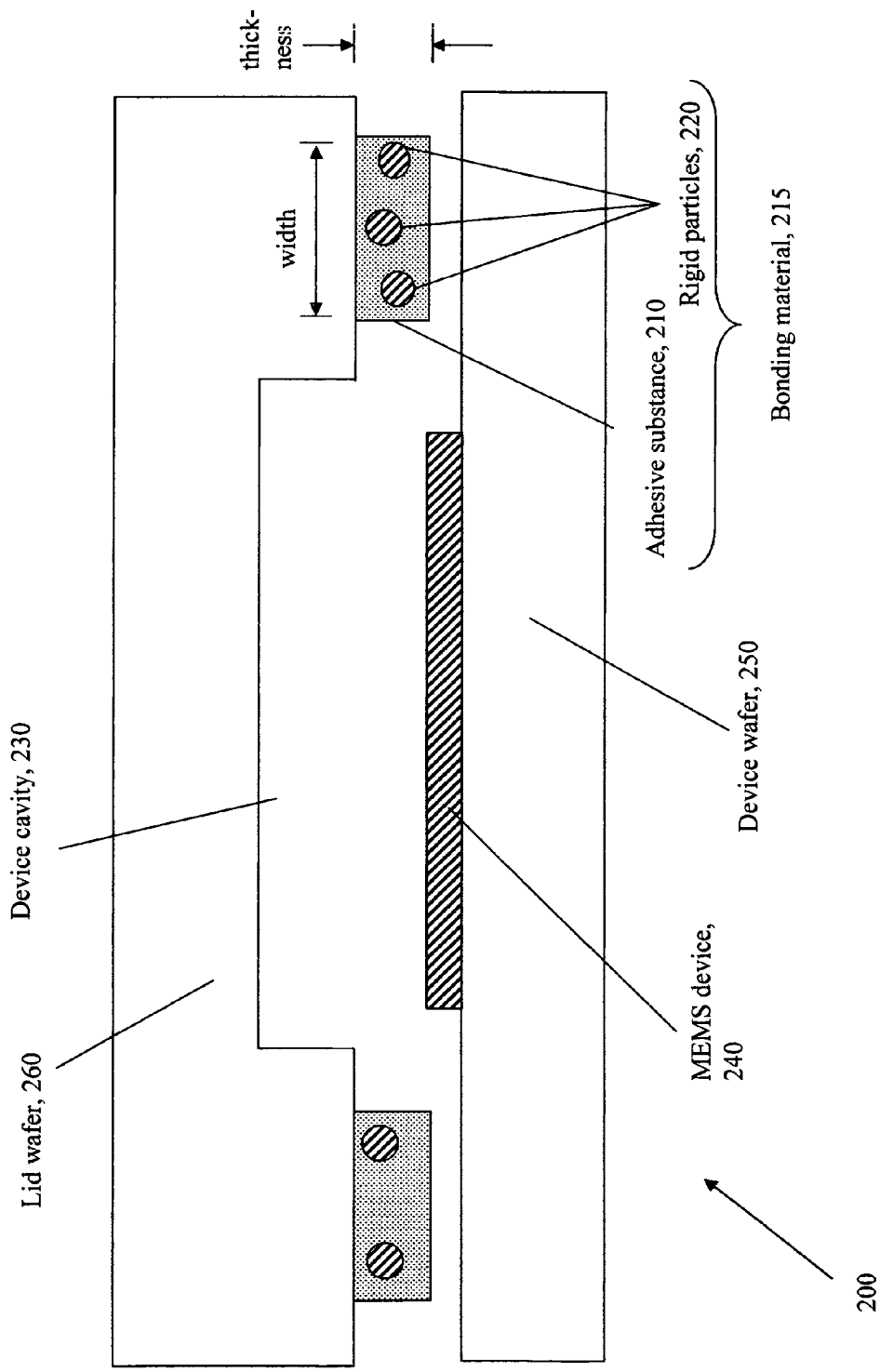
FIG. 2 is diagram showing a lid wafer and device wafer using an exemplary bonding material with embedded rigid particles before bonding.

FIG. 2 shows an exemplary assembly 200 using a bonding material with embedded rigid particles. Although not shown in FIG. 2, it should be understood that the procedure described below may be performed in a wafer bonding chamber, equipped with a wafer chuck to hold the device wafer and a pressure chuck to deliver pressure between a sealing lid wafer and the device wafer. The wafer bonding chamber may also be provided with a heat source to provide heat to melt or cure the adhesive.

A lid wafer 260 is formed with a device cavity 230 by reactive ion etching, for example. The device cavity 230 may be made sufficiently deep to provide clearance for a MEMS device and its movement. The MEMS device 240 is formed on a device wafer 250, using lithographic processes well known in the MEMS art. Since the details of the MEMS device 240 are not necessary to understanding this invention, the MEMS device 240 is depicted only schematically in FIG. 2. It should be understood that the MEMS device 240 may be any of an actuator, a sensor, a switch, a signal filter, or the like.

A bonding material 215 may be applied to an unetched surface of the lid wafer 260, and in a perimeter around the device cavity 230 and MEMS device 240. The bonding material 215 may include an adhesive substance 210 with embedded rigid particles 220, The bonding material 215 may be applied to one or both of the lid wafer 260 and device wafer 250 by, for example, using silk screening techniques. In one embodiment, the bonding material 215 is forced through a patterned silk screen or a stencil with a squeegee onto the surface of lid wafer 260. Alternatively, the bonding material 215 may be deposited by dipping, spraying, painting, or extrusion. The thickness of the bonding material 215 as applied (before assembly with the device wafer 250) may be about 25 μm to about 30 μm. The width of the bonding material 215 as applied may be about 125 μm. The adhesive substance of the bonding material 215 provides the adhesion forces necessary to bond the lid wafer 260 to the device wafer 250, and the rigid particles 220 define the minimum separation between the lid wafer 260 and the device wafer 250.

Depending on the material used for the adhesive substance 210, a number of steps may be taken to prepare the adhesive substance 210 for adhesion to the device wafer. For example, if the adhesive substance 210 is a glass frit with a solvent vehicle such as amyl acetate, the bonding material 215 may be air dried over night or on a hot plate at about 100 degrees centigrade for two hours. Any remaining organic material and/or water solvent may then be removed from the bonding material 215 by air drying at 290 degrees centigrade for about two hours. Finally, the glass frit may be pre-fired in the wafer bonding chamber by air drying for 10 minutes at about 400 to about 450 degrees centigrade. The pre-firing seals the glass frit so that it does not become contaminated during any subsequent processing.

After preparation, the lid wafer 260 with the bonding material 215 may be placed against the device wafer 250 and aligned so that it is positioned properly above the MEMS devices 240. The lid wafer may then be clamped to the device wafer in the proper position, to form the wafer assembly 200, and loaded into a wafer chuck in the wafer bonding chamber.

The sealing environment in the wafer bonding chamber may be changed from air to an encapsulating gas which may be the preferred environment for the operation of the MEMS device. For example, if the MEMS device 240 is an electrical switch, it may be desirable to place the MEMS switch in an environment which discourages electrical arcing. Such environments may include, for example, sulfur hexafluoride ($SF_6$), hydrogen ($H_2$), nitrogen ($N_2$), helium (He) and neon (Ne), vacuum and partial vacuum. The gas pressure may be anywhere from sub-ambient or even high vacuum to super-ambient, for example 70 psi, depending on the requirements of the application. The environment may be maintained permanently within the encapsulation by making the seal hermetic, by, for example, using glass frit as the adhesive substance.

Pressure may be applied to the assembly 200 in the wafer bonding chamber by, for example, squeezing the lid wafer 260 against the device wafer 250. The pressure of the lid wafer 260 against the device wafer 250 may be, for example, about 50 N to 4000 N. The assembly 200 may then be simultaneously heated to cure or melt the adhesive. When the adhesive is molten, the pressure causes the lid wafer 260 to approach the device wafer 250 until a minimum separation is reached, which is defined by the size of the embedded rigid particles.

Figure 3:
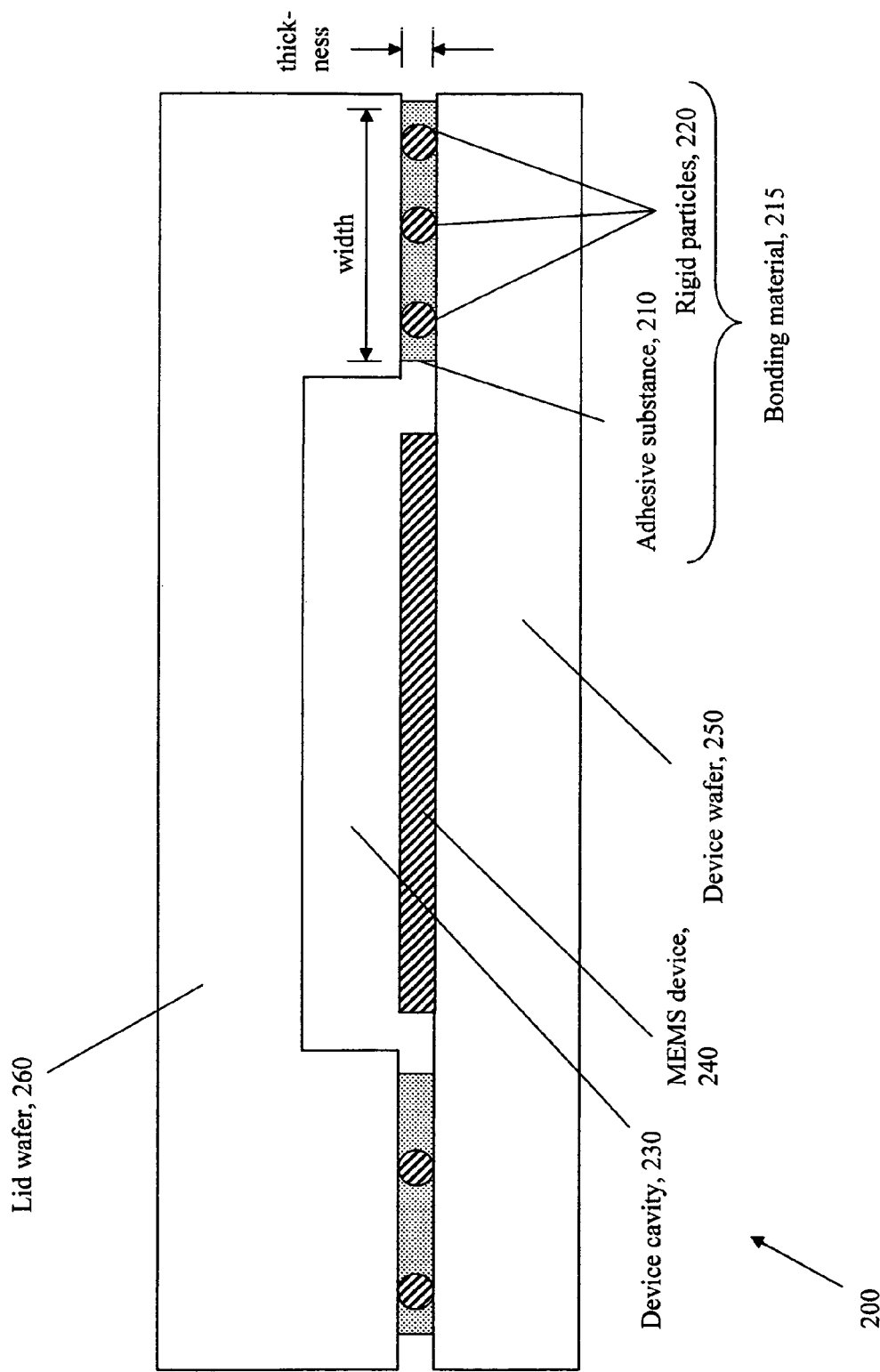
FIG. 3 is a diagram illustrating a lid wafer and device wafer using an exemplary bonding material with embedded rigid particles after assembly and bonding.

The timing of the application of heat to the assembly 200 may depend on the type of adhesive substance 210 used for the application and may be simultaneous with the application of pressure, or may be applied after the pressure is applied. For example, if the adhesive substance 210 is liquid to begin with, such as epoxy, the application of heat to cure the epoxy may take place after the application of pressure to squeeze the lid wafer 260 against the device wafer 250. However, if the adhesive substance is not normally in liquid form, the heat may be supplied before, or simultaneously with the pressure. For example, if the adhesive substance is glass frit, temperatures of about 450 degrees centigrade may be sufficient to melt the glass frit, and the heat is applied simultaneously with the pressure. The assembly may be held at a temperature of between about 400 to about 450 degree centigrade for about 10 minutes or more to melt the glass frit. The melting of the glass frit allows the lid wafer to approach the device wafer to a distance wherein the presence of the rigid particles defines the minimum separation between the lid wafer and the device wafer. The situation is depicted in FIG. 3. The assembly 200 may then be cooled and removed from the wafer bonding tool for singulation.

The embedded rigid particles may be spherical in shape, with diameters of between about 1 μm and about 100 μm. In this embodiment, the embedded rigid particles are sapphire spheres of 10 μm diameter. Accordingly, the minimum distance between the lid wafer 260 and the device wafer 250 may be the diameter of the sapphire spheres, or 10 μm. The width of the bonding material after the bonding of the lid wafer 260 to the device wafer 250 may be about 200 μm.

While an embodiment of the bonding material with embedded rigid particles is described as a glass frit paste mixed with sapphire spheres, it should be understood that any of a number of different materials may be used as the adhesive substance or as the rigid particles. Any adhesive substance which is liquid or may become molten during processing, and is capable of adhering the surface of the lid wafer to the surface of the device wafer, may be used as the adhesive substance. For example, a solder material, which melts at between about 150 and about 200 degrees centigrade may be used. Metal materials, such as indium, gallium/indium, gold/tin and gold/indium, alloys may be used as a lower temperature adhesive substance, or in applications wherein a conductive seal is desired. In other applications not necessarily requiring a hermetic seal, a glue, cement or epoxy may be used as the adhesive substance.

Furthermore, any number of materials may be chosen for the rigid particles. The term "rigid particle" should be understood to mean a substantially incompressible particle whose outer shape does not deform under operating or manufacturing conditions. For example, alumina, silica, metal or diamond may be used for the rigid particles. The rigid particles need not necessarily be spherical, but may instead have other shapes, for example rod shapes, as long as at least one dimension is well-defined or controlled. However, in many applications, spherical particles are preferred because of the likelihood that a single layer will be formed between the lid wafer and the device wafer, such that the minimum separation between the lid wafer and the device wafer is predictable and repeatable. Any material which maintains its rigidity during the processing steps of the wafer bonding, does not dissolve in or interfere with the action of the adhesive substance, and has a well defined dimension may be used as the rigid particle material.

The wafer bonding material with embedded rigid particles may be manufactured simply by simply mixing a powder of the rigid particle particles with the adhesive substance. The relative amount of adhesive substance used in the mixture may be an amount sufficient to ensure a hermetic seal around the rigid particles in the bonding material.

Glass frit, for example, is widely known to produce a reliable hermetic seal when the frit is heated sufficiently to melt the glass frit particles, such that they flow together and form a seal. A glass frit paste may be a suspension of glass particles (<10 μm) with a suitable solvent as the vehicle. The solvent vehicle may be amyl acetate or denatured alcohol with about 1.2% nitrocellulose or equivalent added as an organic binder, which is evaporated before bonding. Bonding occurs when the remaining glass frit particles are heated beyond their melting point. At this point, the glass particles become molten and form the hermetic seal upon cooling. If a bonding material is made from rigid particles of sapphire spheres, and the adhesive substance is a glass frit paste, the bonding material with embedded rigid particles may be made by mixing a volume percentage of between about 3% and about 50% of the sapphire spheres with the glass frit paste. Extra solvent may be added to maintain the viscosity of the bonding material at a level similar to that (within about 50%) of the glass frit adhesive substance prior to introduction of the rigid particle powder. The mixing may be performed by hand, or by a machine supplying agitation or magnetic mixing, for example.

Figure 4:
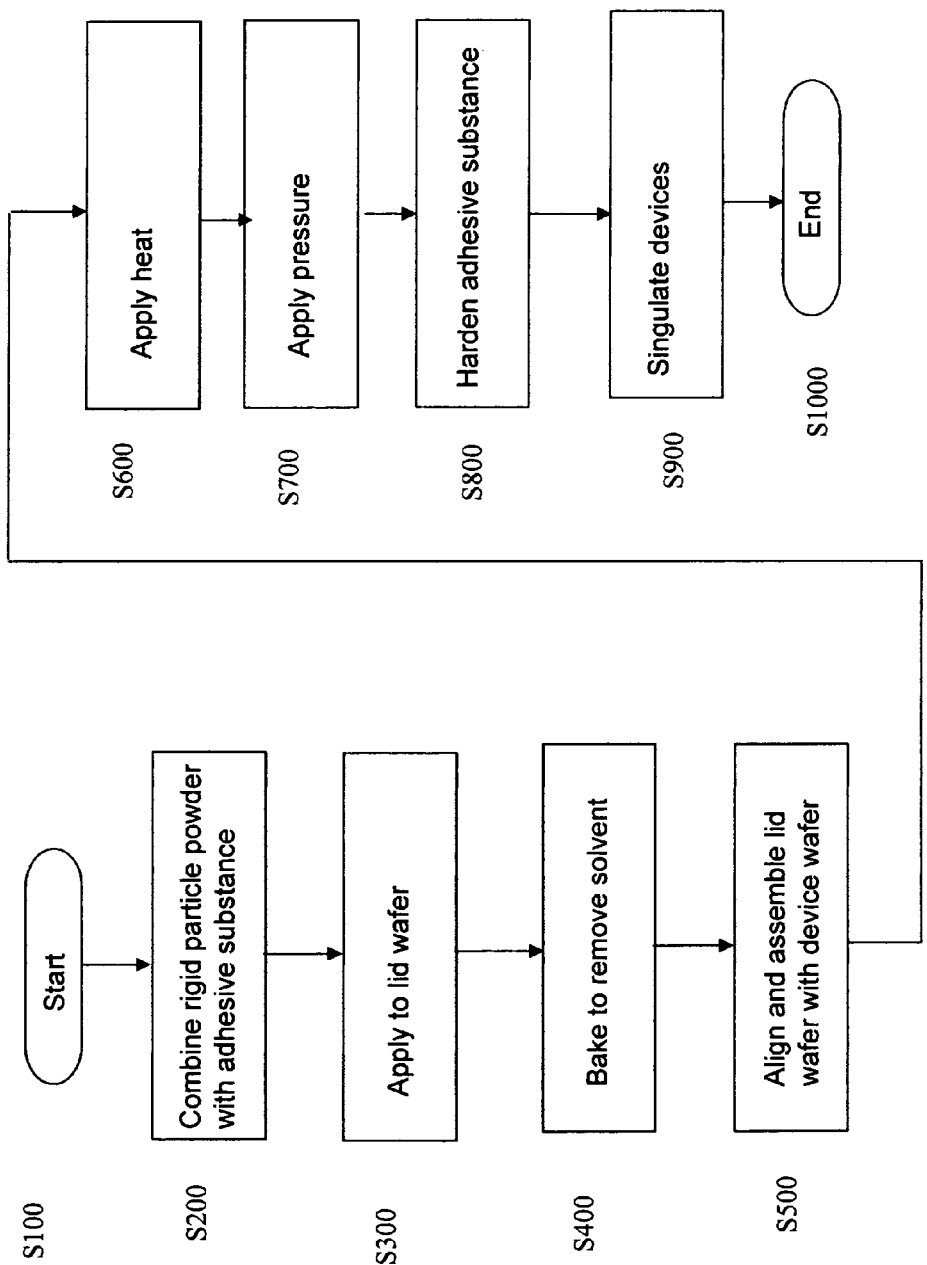
FIG. 4 is an exemplary flowchart illustrating a method for preparing and using the bonding material with embedded rigid particles and its application to a lid wafer and a device wafer.

FIG. 4 is a flowchart illustrating an exemplary method for the preparation and use of the adhesive with embedded rigid particles. The method begins in step S100, and proceeds to step S200, wherein a powder of the rigid particles is mixed with the adhesive substance. The adhesive substance may be a glass frit suspended in a vehicle solvent to form a paste, for example. In step S300, the bonding material is applied to the lid wafer. The bonding material may be applied through either a silk screen or a stencil, for example, to the surface of the lid wafer. In step S400, the lid wafer with the adhesive substance is baked to remove any extra solvent from the adhesive substance. The wafer may be baked at, for example, 290 degrees centigrade for about 2 hours. In step S500, the lid wafer is aligned with the device wafer and affixed to the device wafer using, for example, a clamp. In step S600, heat may be applied to the bonding material to melt the adhesive substance, if the adhesive substance is not already liquid. In step S700, pressure or squeezing is applied between the lid wafer and the device wafer, until a minimum separation is reached defined by the rigid particles. In step S800, the adhesive substance is hardened by, for example, cooling or curing, to bond the lid wafer to the device wafer. Depending on the type of adhesive substance used, the curing step may include applying ultra-violet light and/or heat to the adhesive substance. In step S900, the devices are singulated from the lid wafer and device wafer assembly. The method ends in step S1000.

It should be understood that the method illustrated in FIG. 4 is exemplary only, and that not all the steps make be required to practice the method, nor are the steps required to be performed in the order shown. For example, if the adhesive is ordinarily liquid, the heat applied in step S600 may be omitted. If the adhesive material is ordinarily solid or particulate, the heat may be applied before, or simultaneously with the pressure applied in step S700. Furthermore, the devices may not be singulated, so that step S1000 may be omitted or practiced later.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. While the embodiment described above relates to a microelectromechanical device, it should be understood that the techniques and materials described above may be applied to any of a number of other devices, such as semiconductor devices. Furthermore, details related to the specific method steps are intended to be illustrative only, and the invention is not limited to such embodiments. Accordingly, the exemplary implementations set forth above, are intended to be illustrative, not limiting.

What is claimed is:

1. A method for bonding a lid wafer to a device wafer, comprising:
    providing an adhesive substance comprising an alloy of gold and indium;
    providing a plurality of spherical rigid particles;
    mixing the rigid particles into the adhesive substance to form a bonding material;
    applying the bonding material to at least one of a lid wafer and a device wafer;
    squeezing the lid wafer and the device wafer until a minimum separation is reached defined by the rigid particles; and
    hardening the adhesive substance in the bonding material.

2. The method of claim 1, wherein the spherical rigid particles comprise a sapphire dielectric material.

3. The method of claim 1, the method further comprising:
    heating the bonding material to a temperature of between about 150 and 200 degrees centigrade.

4. The method of claim 1, further comprising heating the adhesive substance to a temperature sufficient to either melt or cure the adhesive substance.

5. The method of claim 1, further comprising:
    heating the bonding material to melt the adhesive substance; and
    cooling the bonding material to harden the adhesive substance.

6. The method of claim 1, further comprising:
    providing an environment around the lid wafer and the device wafer including at least one of air, $SF_6$, He, $N_2$, $H_2$, Ne, vacuum or partial vacuum around the lid wafer and the device wafer.

7. The method of claim 1, wherein the substantially spherical rigid particles comprise sapphire spheres about 10 µm in diameter.

8. The method of claim 6, wherein the environment is provided at a pressure of less than about 70 psi.

9. A bonding material which bonds a lid wafer to a device wafer, comprising:
    an adhesive substance comprising an alloy of gold and indium,
    a plurality of substantially spherical rigid particles mixed into the adhesive substance to form the bonding material, wherein the bonding material is applied to at least one of the lid wafer and the device wafer,
    wherein a dimension of the spherical particle defines a minimum separation between the lid wafer and the device wafer when the lid wafer and device wafer are squeezed together upon hardening of the bonding material.

10. The bonding material of claim 9, wherein the bonding material is disposed in a layer around a perimeter of a MEMS device fabricated on the device wafer.

11. The bonding material of claim 9, wherein the at least one rigid particle is a sphere having a diameter of between about 1 µm and about 100 µm.

12. The bonding material of claim 9, wherein the at least one rigid particle is a sapphire sphere of about 10 µm m diameter.

13. The bonding material of claim 9, wherein the bonding material is a layer about 200 µm wide and about 10 µm thick.

* * * * *